(12) United States Patent
Tanaka et al.

(10) Patent No.: US 6,465,827 B2
(45) Date of Patent: Oct. 15, 2002

(54) RESIN-ENCAPSULATED SEMICONDUCTOR APPARATUS AND PROCESS FOR ITS FABRICATION

(75) Inventors: Jun Tanaka, Chigasaki; Keiko Isoda, Tokyo; Kiyoshi Ogata, Yokohama, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/969,847

(22) Filed: Oct. 4, 2001

(65) Prior Publication Data
US 2002/0060373 A1 May 23, 2002

Related U.S. Application Data

(60) Continuation of application No. 09/689,802, filed on Oct. 13, 2000, which is a continuation of application No. 09/665,062, filed on Sep. 19, 2000, which is a division of application No. 09/012,104, filed on Jan. 22, 1998, now Pat. No. 6,147,374.

(30) Foreign Application Priority Data

Jan. 22, 1997 (JP) ............................................. 9-009276

(51) Int. Cl.$^7$ .......................... H01L 29/76; H01L 29/94; H01L 31/113; H01L 31/119
(52) U.S. Cl. .......................... 257/295; 257/787; 257/666
(58) Field of Search ................................ 257/295, 787, 257/310, 666, 790

(56) References Cited

U.S. PATENT DOCUMENTS

| | | | |
|---|---|---|---|
| 5,117,272 A | * | 5/1992 | Nomura et al. |
| 5,296,716 A | | 3/1994 | Ovashinsky et al. |
| 5,310,863 A | | 5/1994 | Sachdev |
| 5,563,762 A | * | 10/1996 | Leung et al. |
| 6,071,755 A | | 6/2000 | Baba et al. |
| 6,106,906 A | | 8/2000 | Matsuda et al. |

FOREIGN PATENT DOCUMENTS

| | | |
|---|---|---|
| JP | 7-278301 | 10/1995 |
| JP | 8-124917 | 5/1996 |
| JP | 11-233738 | * 8/1999 |

OTHER PUBLICATIONS

Lecture Collections in '96 Ferroelectric Film Memory Technique Forum, Science Forum, Inc., p. 4–4, lines 1–12, Ishihara, Jan. 26, 1996.
Epoxy Molding Compounds for Semiconductor Devices, Thermosetting Resins, vol. 13, No. 4, p. 37, right olumn, lines 8–23, Ogata et al, 1992.
Packaging Technique for Surface Mount Type LSI Packages and Improvements in Its Reliability, p. 451, edited by Hitachi, Ltd.
A Study of Package Cracking During the Reflow Soldering Process, "A" Edition, vol. 55, No. 510, Kitano et al, 1989–2.
Effects of Mold Compound Properties on Lead–on–Chip (LOC) Package Reliability During IR Reflow, 1996 Electronic Components and Technology Conference, Yang et al.

* cited by examiner

*Primary Examiner*—Sheila V. Clark
(74) *Attorney, Agent, or Firm*—Mattingly, Stanger & Malur, P.C.

(57) ABSTRACT

The present invention provides a resin-encapsulated semiconductor apparatus comprising a semiconductor device having a ferroelectric film and a surface-protective film, and an encapsulant member comprising a resin; the surface-protective film being formed of a polyimide. The present invention also provides a process for fabricating a resin-encapsulated semiconductor apparatus, comprising the steps of forming a film of a polyimide precursor composition on the surface of a semiconductor device having a ferroelectric film; heat-curing the polyimide precursor composition film to form a surface-protective film formed of a polyimide; and encapsulating, with an encapsulant resin, the semiconductor device on which the surface-protective film has been formed. The polyimide may preferably have a glass transition temperature of from 240° C. to 400° C. and a Young's modulus of from 2,600 MPa to 6 GPa. The curing may preferably be carried out at a temperature of from 230° C. to 300° C.

30 Claims, 3 Drawing Sheets

RESIN-ENCAPSULATED SEMICONDUCTOR APPARATUS AND PROCESS FOR ITS FABRICATION

This is a continuation application of U.S. Ser. No. 09/689,802, filed Oct. 13, 2000, which is a continuation application of U.S. Ser. No. 09/665,062, filed Sep. 19, 2000, which is a divisional application of U.S. Ser. No. 09/012,104, filed Jan. 22, 1998, now U.S. Pat. No. 6,147,374.

This application is based on application No. H9-9276 filed in Japan, the content of which is incorporated hereinto by reference.

BACKGROUND OF THE INVENTION

1. Field of the Invention

This invention relates to a resin-encapsulated semiconductor apparatus having a semiconductor device with a ferroelectric film, and a process for its fabrication.

2. Description of the Related Art

In recent years, non-volatile or large-capacity semiconductor memory devices having thin films of ferroelectric substances (dielectric materials having a high dielectric constant, or substances having a perovskite crystalline structure) have been proposed. Ferroelectric films have features such as self polarization and high dielectric constant characteristics. Hence, the ferroelectric films have hysteresis characteristics between polarization and electric fields of ferroelectric substances, and their utilization enables materialization of non-volatile memories. Also, the ferroelectric films have such a larger dielectric constant than silicon oxide films that memory cells can be made to have a smaller area when the ferroelectric films are used as capacitive insulation films, to enable materialization of large-capacitance highly integrated RAMs (random access memories).

The ferroelectric films are comprised of a sintered body of a metal oxide, and contain much oxygen which is rich in reactivity. When capacitors are formed by using such ferroelectric films in the capacitive insulation films, it is indispensable, in the upper and lower electrodes of the capacitive insulation films, to use a substance which is stable to oxidation reaction, as exemplified by an alloy chiefly composed of platinum.

After capacitors, interlayer insulation films and so forth have been formed, passivation films are formed on the outermost surfaces of the devices. Silicon nitride or silicon oxide is used in the interlayer insulation films and passivation films, which are usually formed by CVD (chemical vapor deposition) and hence hydrogen is often incorporated in the films.

When semiconductor apparatuses making use of such ferroelectric films are used in electronic equipment for public use, they are required to be inexpensive resin-encapsulated semiconductor apparatuses having good mass productivity. In particular, ferroelectric non-volatile memories are greatly needed for portable equipment as memories substituting flash memories, because of their properties such as low power, low voltage, and non-volatility making refresh operation unnecessary, and the resin-encapsulated semiconductor apparatuses are also desired in order to provide thin type packages.

At present, however, devices that utilize the ferroelectric films as capacitive insulation films are chiefly held by ceramic-encapsulated products, and almost no resin-encapsulated products are available. Devices with a large capacity are also not yet developed. This is because the polarization characteristics of ferroelectric films deteriorate as a result of heat treatment.

Capacitors having ferroelectric films are known to undergo deterioration of polarization characteristics upon their annealing in an atmosphere of hydrogen (Lecture Collections in '96 Ferroelectric Film Memory Technique Forum, published by K.K. Science Forum, Inc. Page 4-4). This deterioration is presumed to be caused by the platinum of upper and lower electrodes which reacts with hydrogen to act as a reducing catalyst to reduce the ferroelectric film. In particular, in the case of large-capacity highly integrated devices, the ferroelectric films are fine in size, and hence this deterioration of the characteristics of the capacitors is forecasted to greatly affect the characteristics of the overall devices.

In the resin-encapsulating of semiconductor devices by transfer molding, encapsulant resins containing fillers (usually silica) are used. The fillers contained in encapsulant resins, however, have such hard particles that the fillers may damage the device surfaces when encapsulated. Moreover, since ferroelectric materials exhibit piezoelectricity, the characteristics of ferroelectric films ma y change upon application of a pressure to the ferroelectric film inside the devices when encapsulated. In the fabrication of DRAMs (dynamic random access memories), α-rays are emitted from radioactive components contained in the fillers, to cause memory soft errors in some cases. Accordingly, in order to prevent the device surfaces from being damaged by the fillers, to prevent application of pressure to the ferroelectric films and to screen α-rays being emitted from the fillers, protective films comprised of polyimide must be previously formed on the device surfaces. Such surface-protective polyimide films are formed by heat-curing polyimide precursor composition films usually at a temperature of about 350 to 450° C. When such a polyimide precursor is heat-cured, the hydrogen contained in the passivation films or interlayer insulation films may diffuse to cause a deterioration of polarization characteristics of the ferroelectric films. Thus, no resin-encapsulated products of devices in which thermoplastic resins are used as surface-protective films are known at present.

SUMMARY OF THE INVENTION

An object of the present invention is to provide a resin-encapsulated semiconductor apparatus having a ferroelectric film with good polarization characteristics and having a high reliability, and a process for its fabrication.

Studies made on conditions under which ferroelectric films cause the deterioration of polarization characteristics have revealed that the deterioration occurs when heated at above 300° C. The present inventors thought that the surface-protective polyimide films could be heat-cured at below 300° C. However, when conventional polyimide precursors are used, which cure at such a low temperature, the resultant resin-encapsulated semiconductor apparatuses had a problem in their solder reflow resistance.

At present, as methods for packaging resin-encapsulated semiconductor apparatuses on printed-wiring substrates, face-down mounting is prevalent. The face-down mounting employs a solder reflowing method, in which leads of a semiconductor device and wiring of a printed-wiring substrate are provisionally joined with a cream solder followed by heating of the entire semiconductor device and substrate to solder them. As methods sorted according to how heat is applied, infrared reflowing and vapor phase reflowing are known, the former being a method utilizing infrared radiated heat and the latter being a method utilizing condensation heat of fluorinated inert liquid.

As encapsulant resin, epoxy resin is usually used. This epoxy resin always absorbs moisture in an ordinary environment. At the time of solder reflow soldering, resin-encapsulated semiconductor apparatuses are exposed to high temperatures of from 215 to 260° C. Hence, when the resin-encapsulated semiconductor apparatuses are packaged on the substrate by reflow soldering, the abrupt evaporation of water causes cracks in the encapsulant resin to bring about a serious problem in view of the reliability of semiconductor devices. Accordingly, in the past, various improvements have been made from the viewpoint of making the encapsulant resin have a lower moisture absorption and have a high adhesion performance (Thermosetting Resins, Vol. 13, No. 4, published 1992, page 37, right column, lines 8–23).

The present inventors have examined resin cracks produced in conventional resin-encapsulated semiconductor devices, and have found that peeling occurs at the interface between the device surface-protective polyimide film and the encapsulant resin, and that this is the starting point of causing cracks in the encapsulant resin. They have also found that this peeling is influenced by physical properties of surface-protective films, in particular, glass transition temperature and Young's modulus.

Now, as a result of further detailed studies, it has been found that ferroelectric films may cause less deterioration of polarization characteristics when the device surface-protective polyimide films are formed by heat treatment in the temperature range of from 230° C. to 300° C. It has been also found that, when the polyimide formed at such heat treatment temperature has a glass transition temperature of from 240° C. to 400° C. and a Young's modulus of from 2,600 MPa to 6 GPa, the resin-encapsulated semiconductor apparatus has a superior solder reflow resistance and no peeling may occur at the interface between the device surface-protective polyimide film and the encapsulant resin, promising high reliability.

Based on these new findings, the present invention provides a resin-encapsulated semiconductor apparatus comprising a semiconductor device having a ferroelectric film and a surface-protective film, and a encapsulant member comprising a resin, the surface-protective film being formed of a polyimide. The present invention has first made it possible to materialize such a device for the first time.

The present invention also provides a process for fabricating a resin-encapsulated semiconductor apparatus, the process comprising the steps of;

forming a polyimide precursor composition film on the surface of a semiconductor device having a ferroelectric film;

heat-curing the polyimide precursor composition film to form a surface-protective film formed of a polyimide; and encapsulating with a encapsulant resin the semiconductor device on which the surface-protective film has been formed.

The polyimide used in the present invention as a material for the surface-protective film may preferably have a glass transition temperature of from 240° C. to 400° C. and a Young's modulus of from 2,600 MPa to 6 GPa. Use of such a polyimide makes it possible to obtain a semiconductor device having a high reliability, without causing any cracks even by reflow soldering. The polyimide precursor composition film may preferably be heat-cured at a temperature of from 230° C. to 300° C., but may be done at a temperature higher than 300° C. so long as the heat treatment is carried out at 350° C. or below for a short time (usually within 4 minutes, depending on the heat resistance of semiconductor devices) and also the polyimide film thus formed has a Young's modulus of 3,500 MPa or above and a glass transition temperature of 260° C. or above, thus the objects of the present invention can be achieved without causing any deterioration of polarization characteristics of the ferroelectric film.

Incidentally, the fabrication process of the present invention may also be applied to resin-encapsulated laminates in which polyimide films are used for purposes other than surface-protective films, e.g., insulating films.

DETAILED DESCRIPTION OF THE INVENTION

Figure 1:
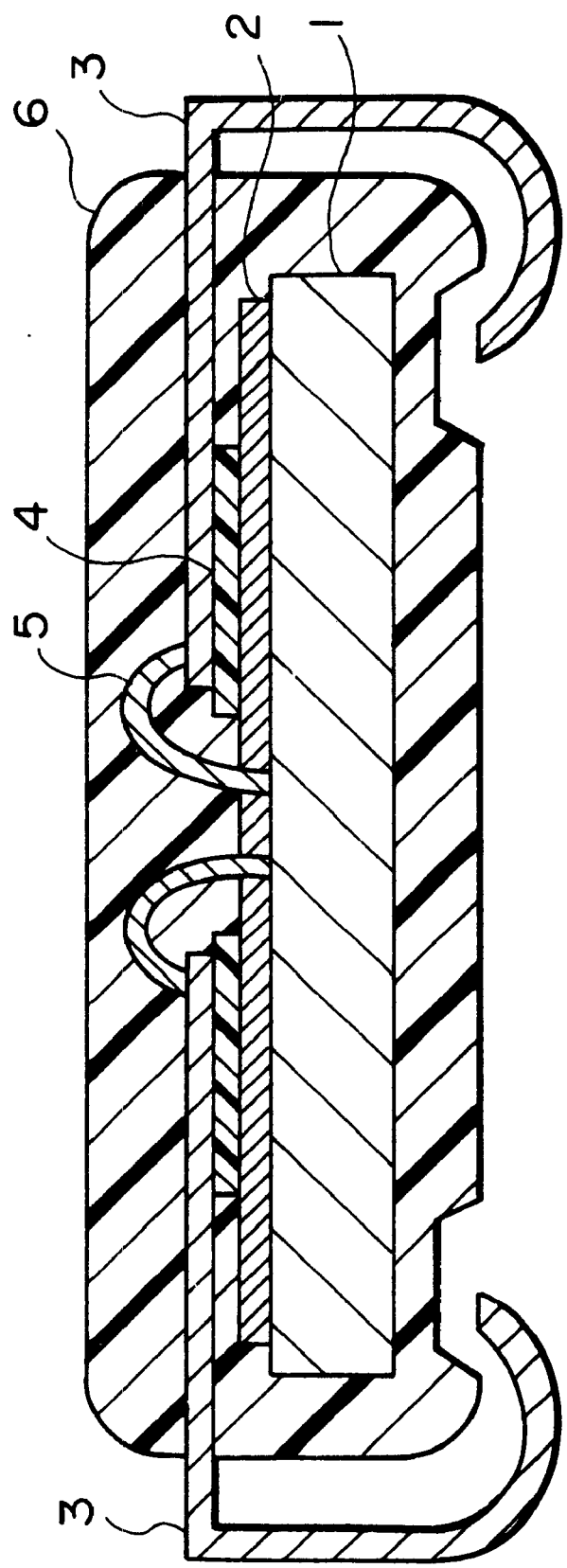
FIG. 1 is a cross-sectional view of an LOC (lead on chip) type resin-encapsulated semiconductor apparatus.

As a polyimide precursor preferable in the present invention, which can obtain the polyimide having a glass transition temperature of from 240° C. to 400° C. and a Young's modulus of from 2,600 MPa to 6 GPa by heat-curing it at 230° C. to 300° C., it may include polyamic acids comprised of a repeating unit represented by the following general formula (I).

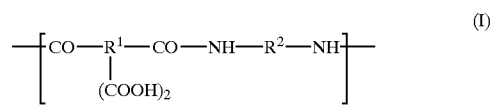

wherein $R^1$ is at least one of tetravalent aromatic organic groups shown in the following chemical formula group (II), and $R^2$ is at least one of divalent aromatic organic groups shown in the following chemical formula groups (III) and (IV).

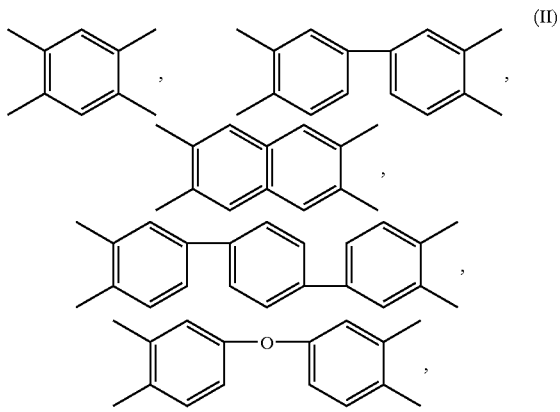

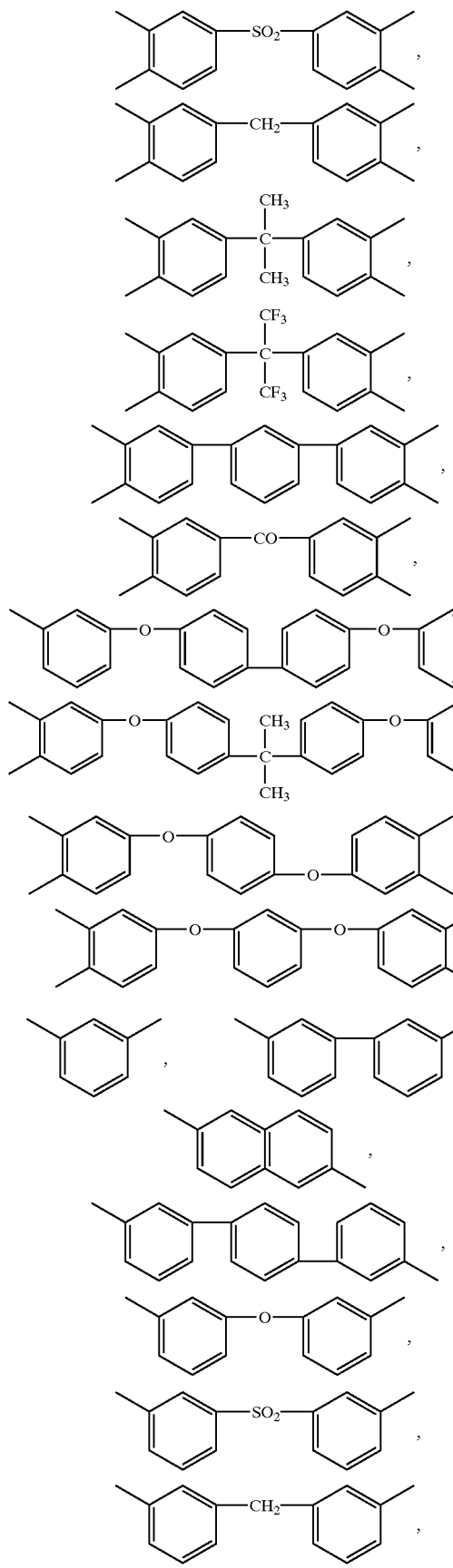
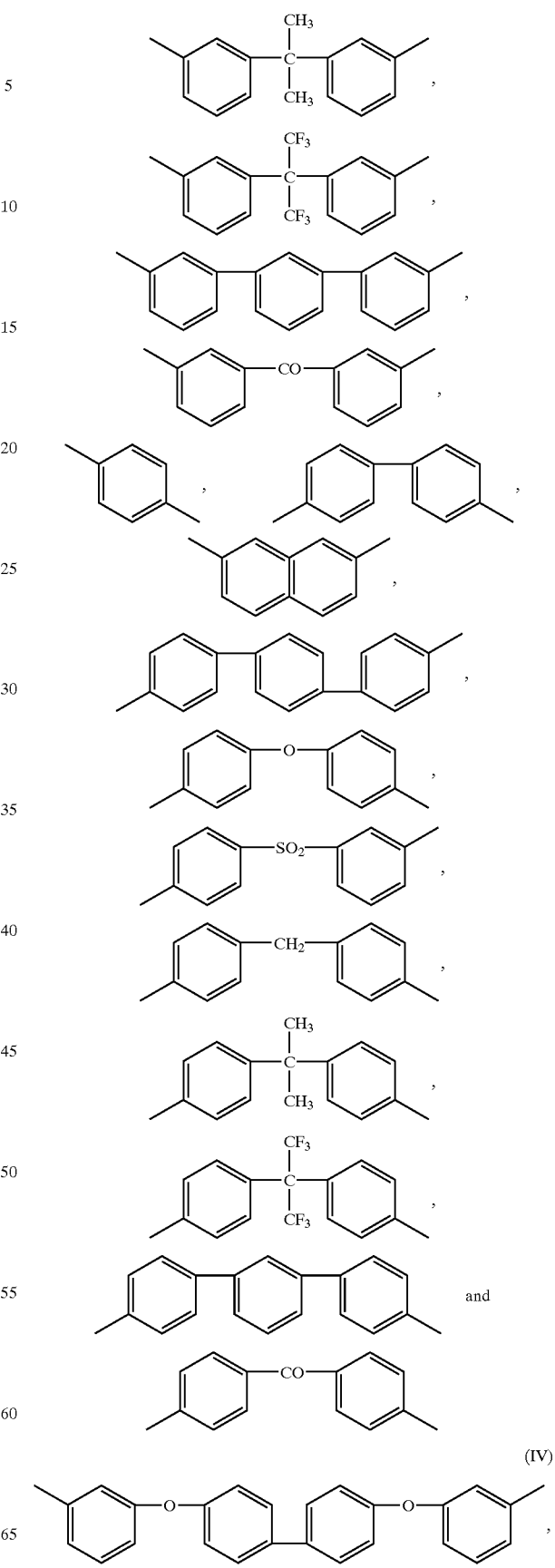

-continued

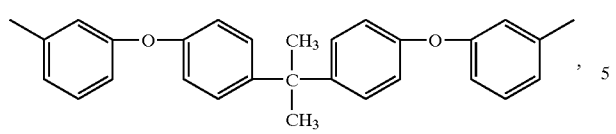
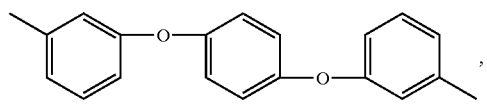
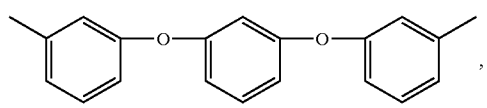
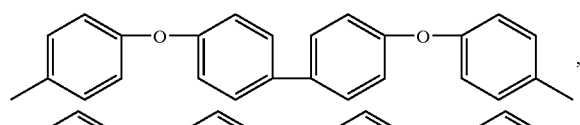
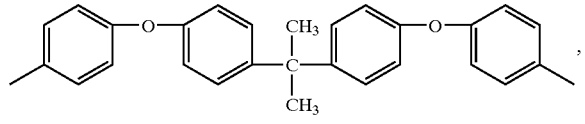
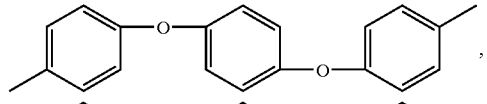
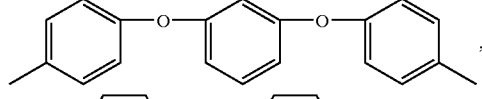
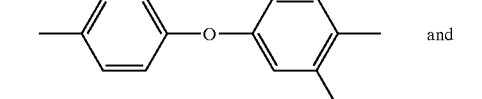

and

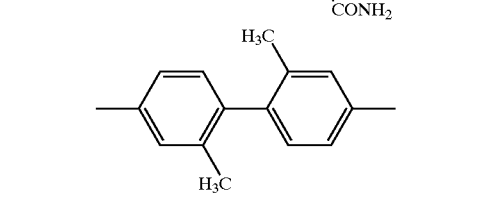

Of these polyamic acids, polyamic acids wherein $R^1$ is at least one of those listed in the following chemical formula group (VII) and $R^2$ is at least one of those listed in the following chemical formula group (VIII) are particularly suited to the present invention.

(VII)

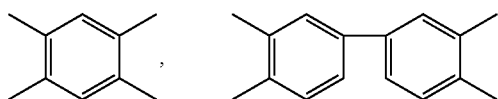
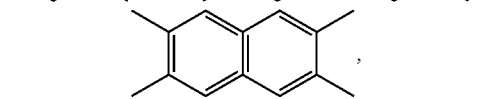
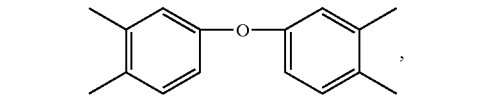

-continued

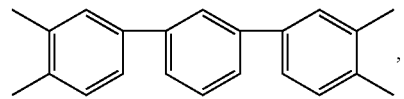
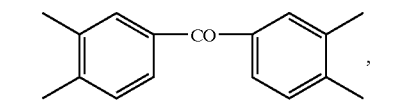
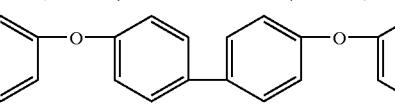

and

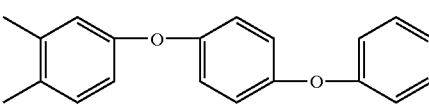

(VIII)

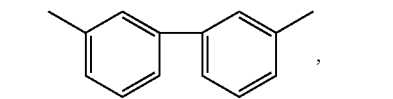
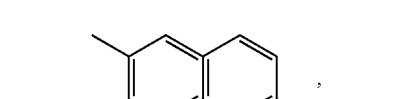
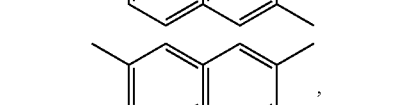
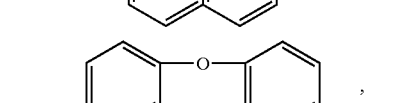
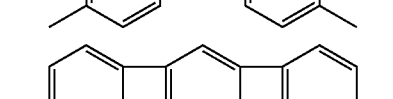
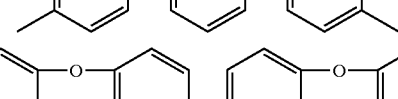
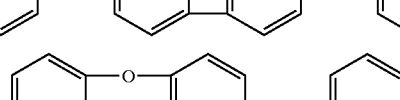
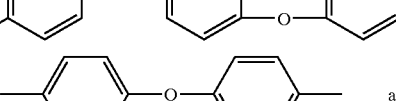
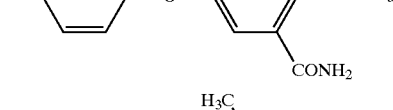

and

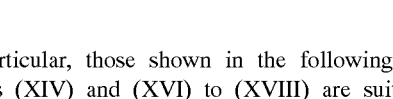
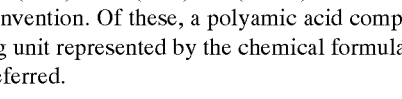

In particular, those shown in the following chemical formulas (XIV) and (XVI) to (XVIII) are suited to the present invention. Of these, a polyamic acid comprised of a repeating unit represented by the chemical formula (XVI) is most preferred.

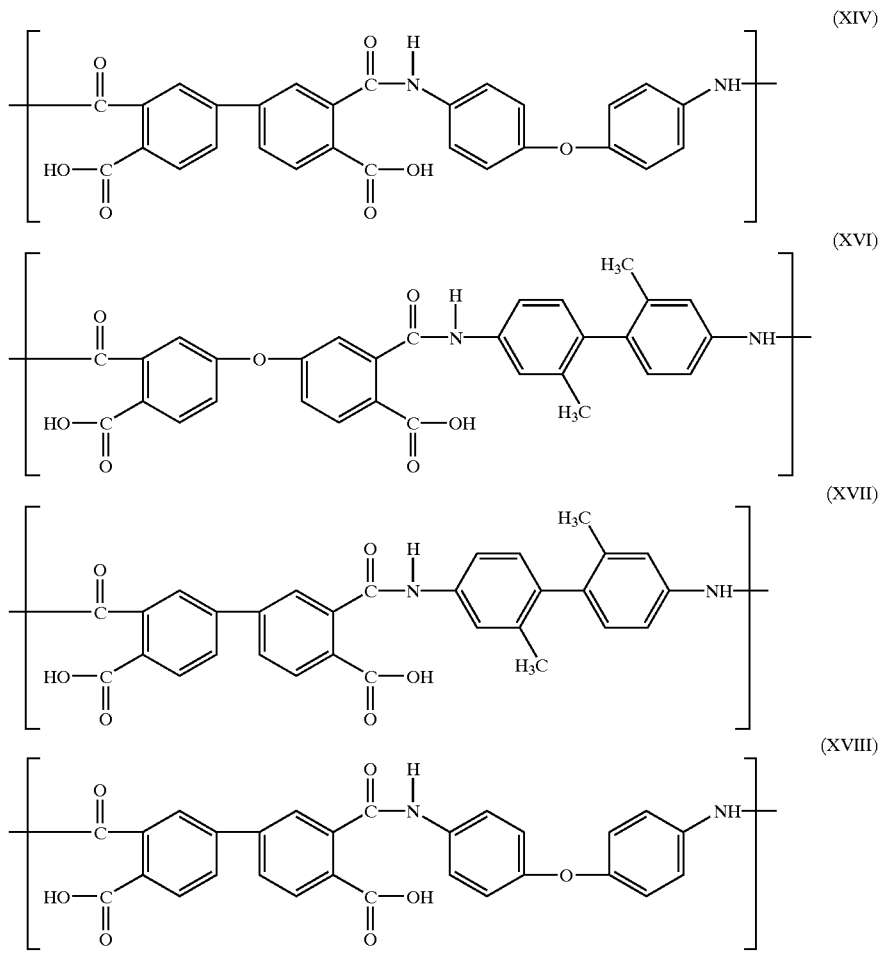

The polyamic acid used in the present invention may further have, in addition to the unit represented by the formula (I), a repeating unit having the same structure as the one represented by the above general formula (I) but having a siloxane group as $R^2$, so long as it is not more than 10.0 mol % of the number of total repeating units. Here, the siloxane group used as $R^2$ may be an aromatic siloxane group, and may be at least one of groups having the structure represented by the following chemical formula group (VI).

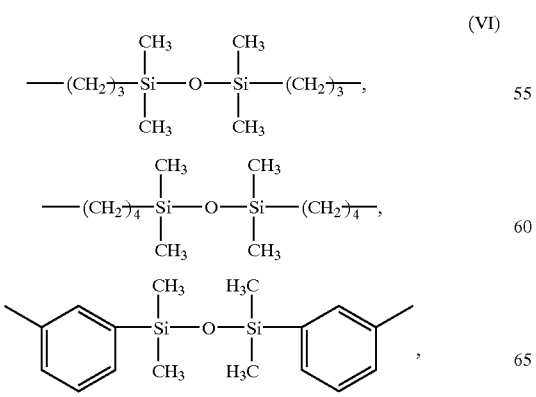

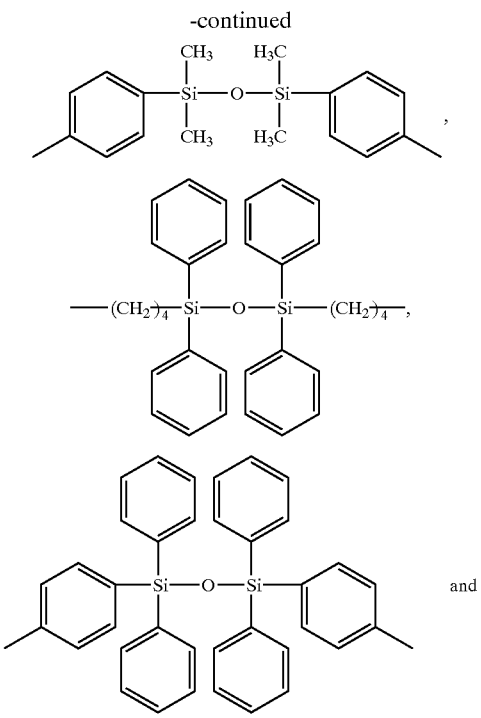

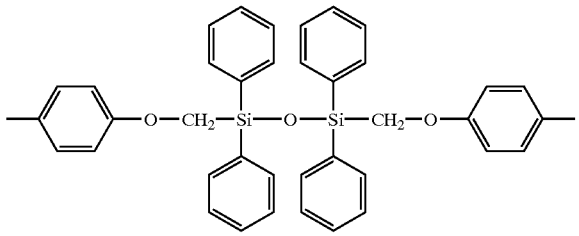

The polyimide precursor composition can be formed into films by, e.g., when the composition is in the form of a liquid or a varnish, coating or spraying the composition on the device surface, optionally followed by heating to bring it into a half-cured state (a state of not completely being made into imide). For example, a means such as rotary coating using a spinner may be used. The coating film thickness may be adjusted according to coating means, solid concentration of the polyimide precursor composition, viscosity and so forth. When the polyimide precursor composition is in the form of a sheet, it may be placed on or stuck to the device surface to form a film.

The surface-protective film often has openings formed in order to lay the underlying layer bare at the desired portions, e.g., at bonding pads. To form such openings, a resist film may be formed on the surface of the polyimide precursor composition film standing half-cured or the polyimide film having been cured, followed by pattern processing by a conventional fine processing technique, and then the resist film may be removed. When the openings are formed in a half-cured state, the pattern processing is followed by heat treatment to completely cure the coating.

When the polyimide precursor composition is a photosensitive composition, the composition film may be exposed to light through a mask with a given pattern and then the unexposed areas may be dissolved and removed using a developing solution, followed by heat curing to form a polyimide film with the desired pattern.

Accordingly, the polyimide precursor composition used in the present invention may preferably be a photosensitive polyimide precursor composition containing the above polyamic acid and further containing an amine compound having carbon-carbon double bonds, a bisazide compound, a photopolymerization initiator and/or a sensitizer.

The amine compound may specifically include, as preferred examples, 2-(N,N-dimethylamino)ethyl acrylate, 2-(N,N-dimethylamino)ethyl methacrylate, 3-(N,N-dimethylamino)propyl acrylate, 3-(N,N-dimethylamino) propyl methacrylate, 4-(N,N-dimethylamino)butyl acrylate, 4-(N,N-dimethylamino)butyl methacrylate, 5-(N,N-dimethylamino)pentyl acrylate, 5-(N,N-dimethylamino) pentyl methacrylate, 6-(N,N-dimethylamino)hexyl acrylate, 6-(N,N-dimethylamino)hexyl methacrylate, 2-(N,N-dimethylamino)ethyl cinnamate, 3-(N,N-dimethylamino) propyl cinnamate, 2-(N,N-dimethylamino)ethyl-2,4-hexadienoate, 3-(N,N-dimethylamino)propyl-2,4-hexadienoate, 4-(N,N-dimethylamino)butyl-2,4-hexadienoate, 2-(N,N-diethylamino)ethyl-2,4-hexadienoate and 3-(N,N-diethylamino)propyl-2,4-hexadie noate.

Any of these may be used alone or in the form of a mixture of two or more, and may be mixed in a proportion of from 10 parts by weight to 400 parts by weight based on 100 parts by weight of the polyamide acid polymer.

The bisazide compound may specifically include, as preferred examples, compounds listed in the following chemical formula groups (IX) and (X). Any of these compounds may be used alone or in the form of a mixture of two or more, and may be mixed in a proportion of from 0.5 part by weight to 50 parts by weight based on 100 parts by weight of the polymer.

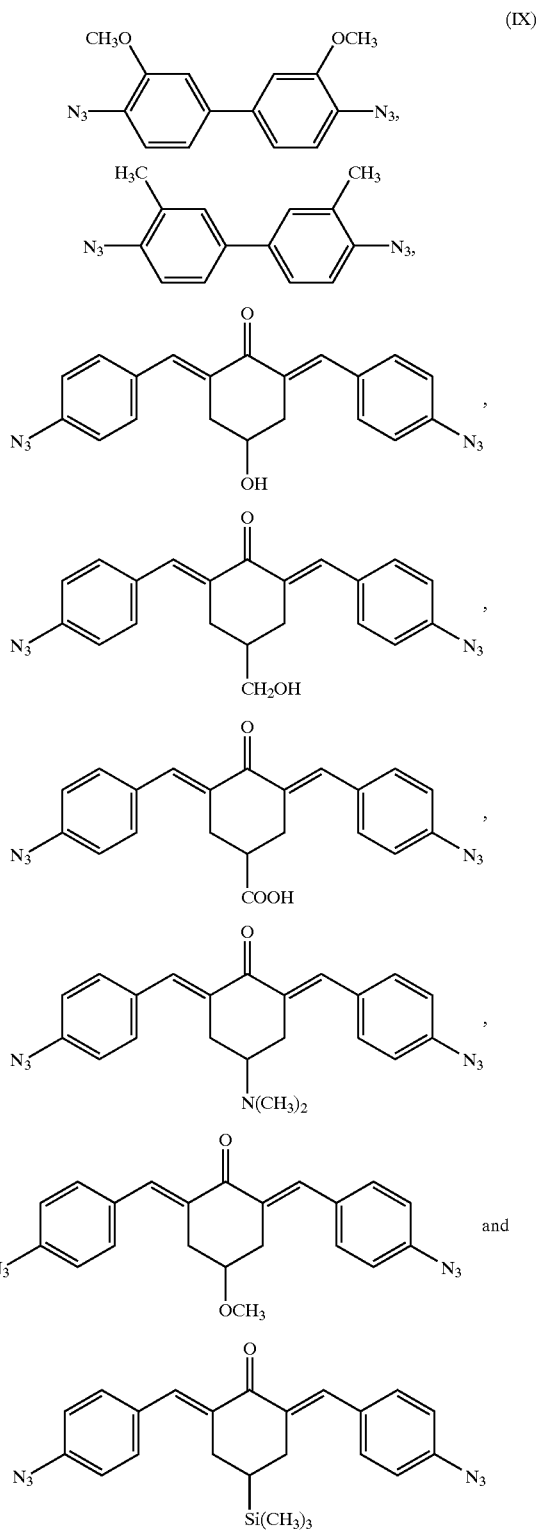

(IX)

-continued (X)

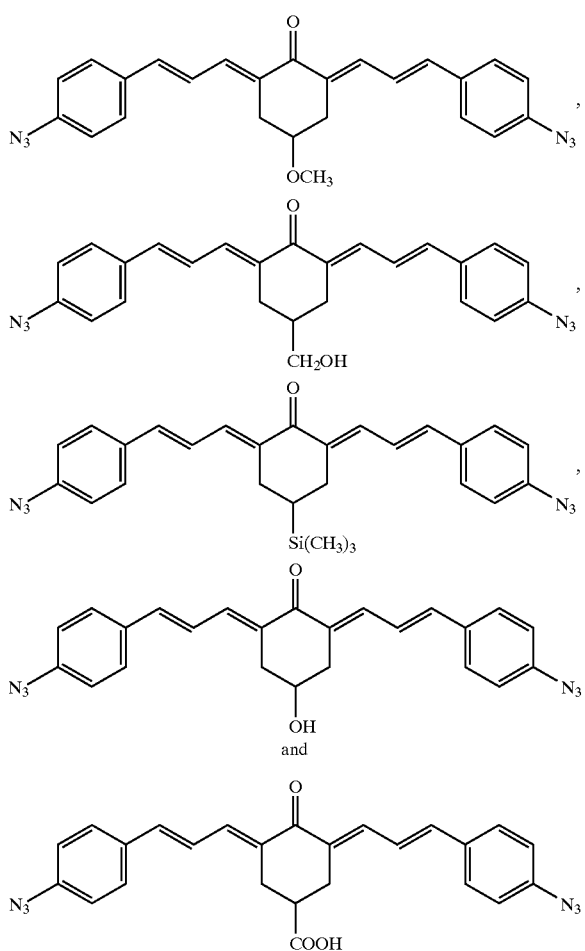

As examples of the photopolymerization initiator and sensitizer, they specifically include, but are not limited to, Michler's ketone, bis-4,4'-diethylaminobenzophenone, benzophenone, benzoyl ether, benzoin isopropyl ether, anthrone, 1,9-benzoanthrone, acridine, nitropyrene, 1,8-dinitropyrene, 5-nitroacetonaphthene, 2-nitrofluorene, pyrene-1,6-quinone-9-fluorene, 1,2-benzoanthraquinone, anthanthrone, 2-chloro-1,2-benzoanthraquinone, 2-bromobenzoanthraquinone, 2-chloro-1,8-phthaloylnaphthalene, 3,5-diethylthioxanthone, 3,5-dimethylthioxanthone, 3,5-diisopropylthioxanthone, benzyl, 1-phenyl-5-mercapto-1H-tetrazole, 1-phenyl-5-Mertex, 3-acetylphenanthrene, 1-indanone, 7-H-benz[de]anthracen-7-one, 1-naphthol aldehyde, thioxanthen-9-one, 10-thioxanthenone and 3-acetylindol. Any of these may be used alone or in the form of a mixture of two or more of them. The photopolymerization initiator and sensitizer used in the present invention may preferably be mixed in a proportion of from 0.1 part by weight to 30 parts by weight based on 100 parts by weight of the polymer.

As an exposure light source used in the above patterning, which is carried out by photolithography, any of ultraviolet rays, as well as visible light rays and radiation rays, may be used.

The developing solution may include non-protonic polar solvents such as N-methyl-2-pyrrolidone, N-acetyl-2-pyrrolidone, N,N-dimethylformamide, N,N-dimethylacetamide, dimethyl sulfoxide, hexamethylphosphramide, dimethylimidazolidinone, n-benzyl-2-pyrrolidone, N-acetyl-ε-caprolactam and γ-butylolactone, any of which are used alone, and solutions of a mixture of any of poor solvents for polyamic acid, such as methanol, ethanol, isopropyl alcohol, benzene, toluene, xylene, methyl cellosolve and water, and any of the above non-protonic polar solvents, either of which may be used.

The pattern formed by development is subsequently washed with a rinsing solution to remove the developing solution. As the rinsing solution, a poor solvent for polyamic acid, having a good miscibility for the developing solution may preferably be used, and may include, as preferred examples, the above methanol, ethanol, isopropyl alcohol, benzene, toluene, xylene, methyl cellosolve and water.

The heat treatment to heat-cure the polyimide precursor composition film may respectively be carried out by heating using a hot plate. Use of the hot plate enables imidation and film formation of polyimide precursor materials in a shorter time than heat treatment employing a furnace such as an oven furnace or a diffusion furnace. Thus, the time for heating the ferroelectric film can be made shorter.

The semiconductor device to which the present invention is applied may include, e.g., non-volatile semiconductor memories and large-capacity DRAMs. The ferroelectric film in the semiconductor device may be any of films comprised of a dielectric material having a high dielectric constant, and may include, e.g., ferroelectric materials having a perovskite crystalline structure.

The dielectric material may include lead titanate zirconate $Pb(Zr,Ti)O_3$ (abbreviated "PZT"), barium strontium titanate $(Ba,Sr)TiO_3$ (abbreviated "BST"), and niobium strontium bismuth tantalate $(SrBi_2(Nb,Ta)_2O_9$ (called "Y1 system"). These materials can be formed into films by chemical vapor deposition (CVD), the sol-gel method, or sputtering.

An example of the resin-encapsulated semiconductor apparatus of the present invention will be described below, taking as an example a lead-on-chip type ("LOC type") resin-encapsulated semiconductor apparatus shown in FIG. 1. The resin-encapsulated semiconductor apparatus is by no means limited to the LOC type, and may be a different-type resin-encapsulated semiconductor apparatus such as a chip-on-lead type ("COL type").

The resin-encapsulated semiconductor apparatus of the present invention has a semiconductor device 1 having on at least part of its surface a surface-protective film 2 comprised of polyimide; an outer terminal 3; an adhesive member 4 which bonds the semiconductor device 1 and the outer terminal 3 through the surface-protective film 2; wiring 5 for achieving conduction between the semiconductor device 1 and the outer terminal 3; and a encapsulant medium 6 for encapsulating the entire semiconductor device 1 and wiring 5. The surface-protective film 2 is comprised of a polyimide obtained by heat-curing the polyimide precursor previously described. In the resin-encapsulated semiconductor apparatus shown in FIG. 1, the outer terminal 3 also serves as a lead frame.

An example of the process for fabricating the resin-encapsulated semiconductor apparatus of the present invention will be described below with reference to FIGS. 2A to 2F. FIGS. 2A to 2F show a process for fabricating the LOC type resin-encapsulated semiconductor apparatus shown in FIG. 1. The fabrication process of the present invention is not limited to the fabrication of the LOC type resin-encapulated semiconductor apparatus, and may also be applied to the fabrication of the resin-encapsulated semi-conductor apparatuses of the other type such as COL type so long as they are resin-encapsulated semiconductor apparatuses obtained by previously bonding semiconductor devices and outer terminals (lead frames) and then encapsulating them with a molding resin.

Figure 2A:
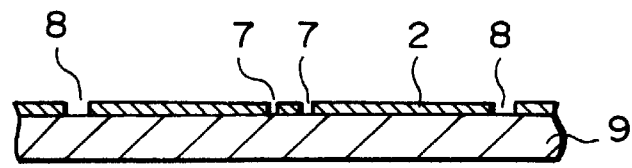
FIGS. 2A to 2F illustrate an example of a process for fabricating the resin-encapsulated semiconductor apparatus.
Figure 2B:
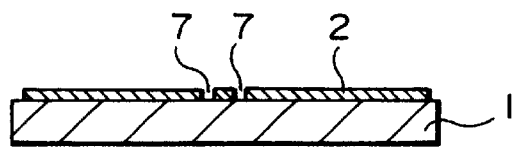

(1) Surface-protective Film Forming Step:

As shown in FIG. 2A, a surface-protective film 2 comprised of polyimide is formed on a silicon wafer 9 on which semiconductor device regions and wiring layers (not shown) have been built up. The surface-protective film 2 may be formed by, e.g., a method in which the polyimide precursor composition previously described is coated on the wafer 9, followed by heat curing, and a method in which the polyimide precursor composition previously molded in a filmy form is placed on the surface of the wafer 9, followed by heat curing.

As previously described, in the surface-protective film 2, openings are formed at predetermined positions, and the surface of the semiconductor device 1 is laid bare at the areas of bonding pad portions 7 and scribing regions 8. To form the surface-protective film 2 in a pattern with openings corresponding to the bonding pad areas 7 and scribing regions 8, wet etching may be used which is a method making use of a photoresist and a polyimide etching solution, and besides a photo-etching technique such as dry etching in which a patterned inorganic film or metal film is used as a mask and the polyimide film laid bare is removed by oxygen plasma. Alternatively, using a mask, the polyimide precursor composition may be coated except at the portions of the regions 7 and 8, and thus the surface-protective film 2 can be patterned.

The silicon wafer 9 on which the surface-protective film 2 has been formed in this way is cut off at its scribing regions to obtain the semiconductor device 1 (shown in FIG. 2B) having the surface-protective film 2. Here, a process is described in which the silicon wafer 9 with the surface-protective film 2 having been formed thereon is cut off to obtain the semiconductor device 1 having the surface-protective film 2. In the present invention, without limitation thereto, the silicon wafer 9 may be cut off to obtain a semiconductor device 1 and thereafter the film of the polyimide precursor compositon may be formed on the surface of the semiconductor device 1 thus obtained, followed by heat curing to obtain the semiconductor device 1 having the surface-protective film 2.

Figure 2C:
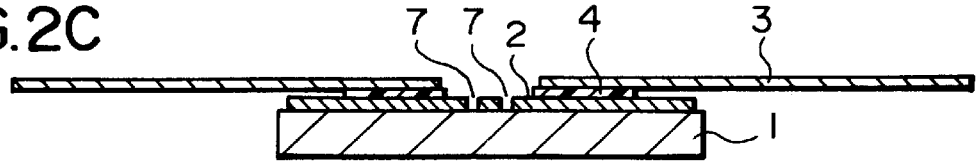
Figure 2D:
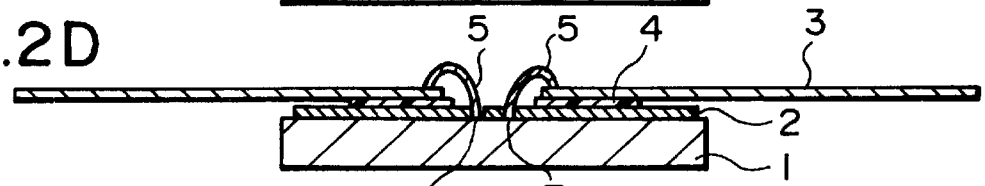

(2) Device Mounting Step:

The outer terminal 3 and the semiconductor device 1 are bonded through an adhesive member 4 to obtain an assembly comprised of, as shown in FIG. 2C, the semiconductor device 1 and the outer terminal 3 which are bonded through the surface-protective film 2 and the adhesive member 4. Subsequently, as shown in FIG. 2D, the semiconductor device 1 is wired with gold wires 5 across its bonding pad areas 7 and outer terminals 3 by means of a wire bonder to ensure the conduction between the semiconductor device 1 and the outer terminals 3.

Figure 2E:
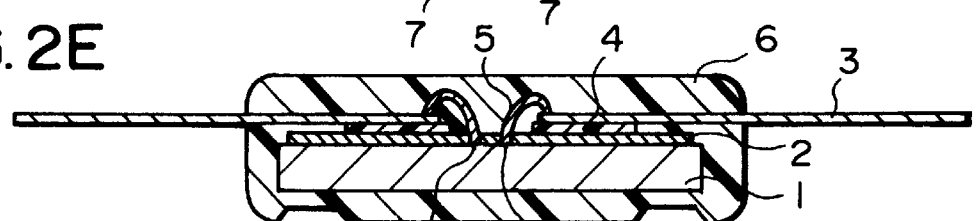
Figure 2F:
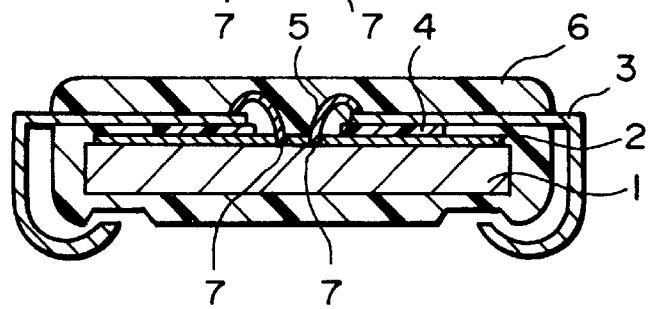

(3) Sealing Step:

As shown in FIG. 2E, molding is applied u sing a silica-containing epoxy resin at a molding temperature of 180° C. and a molding pressure of 70 kg/cm² to form an encapsulant member 6. Finally, the outer terminals 3 are bent into the desired shape, to thus obtain the LOC type resin-encapsulated semiconductor apparatus as shown in FIG. 2F.

Figure 4:
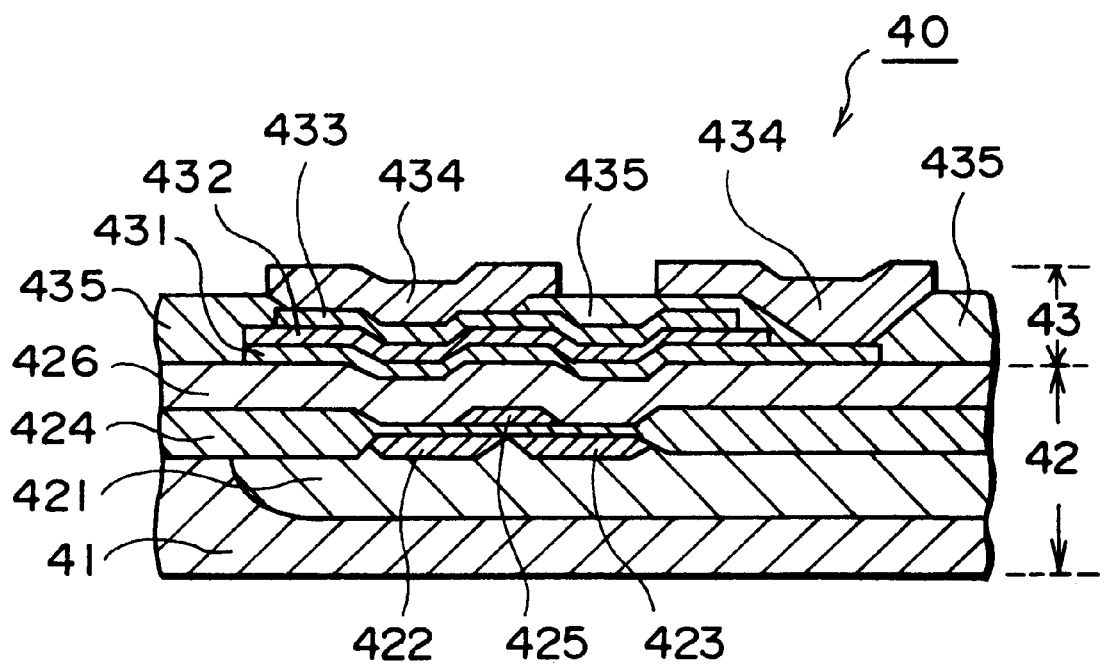
FIG. 4 is a cross-sectional view of a semiconductor device having a ferroelectric film.

The semiconductor device used in the resin-encapsulated semiconductor apparatus of the present invention will be described below. As an example of the semiconductor device used in the resin-encapsulated semiconductor apparatus of the present invention, a ferroelectric memory comprising a memory cell of one transistor/one capacitor is shown in FIG. 4 as a cross-section at its memory cell portion.

This ferroelectric memory, 40, is a laminate comprising a silicon substrate 41; formed on its surface, a CMOS (complementary metal oxide semiconductor) transistor layer 42 consisting of a p- or n-type well 421, a set of source 422 and drain 423, an oxide film 424, a gate 425 and an insulating layer 426, and further formed on the surface of the insulating layer 426 a capacitor 43 consisting of a lower electrode layer 431, a ferroelectric film 432, an upper electrode layer 433, a metal wiring layer 434 and an insulating layer 435. Thus, the present invention is applied to the instance where the surface-protective polyimide film is formed on the surface of the laminate (inclusive of the semiconductor device) having the ferroelectric film 432 and thereafter the assembly formed is encapsulated with resin. In the example shown in FIG. 4, the surface-protective polyimide film is so formed as to cover the metal wiring layer 434 and insulating layer 435 of the capacitor 43.

As described above in detail, the resin-encapsulated ferroelectric device having the surface-protective polyimide film is provided by the present invention. Since the polyimide precursor is heat-cured at a temperature of from 230° C. to 300° C., the ferroelectric film may cause less deterioration of polarization characteristics. Also, since the polyimide constituting the surface-protective film 2 has a glass transition temperature of 240° C. or above and a Young's modulus of 2,600 MPa or above, a resin-encapsulated semiconductor apparatus can be obtained which has a superior solder reflow resistance after being resin encapsulating and in which no peeling may occur at the interface between the polyimide and the encapsulant resin at the time of refloing solder. Also, since the polyimide precursor composition is used which is heat-cured at a temperature higher than 300° C. but not higher than 350° C. for a heating time within 4 minutes and also the polyimide obtained after curing of which has a glass transition temperature of 260° C. or above and a Young's modulus of 3,500 MPa or above, it is possible to obtain a resin-encapsulated semiconductor apparatus that may cause less deterioration of polarization characteristics of the ferroelectric film and has a superior solder reflow resistance after resin encapsulating and in which no peeling may occur at the interface between the polyimide and the sealing resin at the time of reflowing solder. Thus, according to the present invention, a resin-encapsulated semiconductor apparatus with a high reliability can be obtained.

DETAILED DESCRIPTION OF THE PREFERRED EMBODIMENTS

Examples of the present invention will be given below.

With respect to polyimide films used in the following Examples, the Young's modulus and the glass transition temperature were measured using polyimide films separately prepared. More specifically, first, using a hot plate, a polyimide film was formed on a silicon wafer under the same conditions as in each Example, and thereafter the polyimide film was peeled off the wafer, followed by washing with water and then drying to obtain a polyimide film with a layer thickness of from 9 to 10 $\mu$m. This polyimide film was cut to make a test piece 25 mm long×5 mm wide. Using a tensile tester AUTOGRAPH AG-100E (manufactured by Shimadzu Corporation), tensile load and elongation with respect to the film were measured under conditions of a rate of pulling of 1 mm/minute to determine the Young's modulus. The polyimide film was also cut in 15 mm long×5 mm wide to make a test piece. At a load of 2 g/f (about $4×10^{-2}$ N/m²) in the elongation direction and a rate of temperature rise of 5° C./minutes, a thermal expansion curve obtained from thermomechanical measurement using TA-1500 (manufactured by Shinku Riko ULVAC) was prepared, and from this curve the glass transition temperature was determined.

The solder reflow resistance of the resin-encapsulated semiconductor apparatus was measured in the following way. First, the resin-encapsulated semiconductor apparatus was moistened by leaving it for 168 hours under the thermostatic hygrostatic conditions of 85° C. and 85%. The resin-encapsulated semiconductor apparatus thus moistened was heated to a maximum temperature of 240 to 250° C. for 10 seconds and then left to cool to room temperature, and this step was repeatedly carried out three times. Thereafter, using an ultrasonic flaw detector, any interfacial failure between the polyimide and the encapsulant resin was non-destructively observed to examine the solder reflow resistance of the surface-protective polyimide film. With regard to the temperature profile of an infrared solder reflowing furnace, the temperature profile described in "Packaging Techniques for Surface Mount Type LSI Packages and Improvement in Its Reliability", p. 451 (compiled by Hitachi Ltd., Semiconductor & Integrated Circuits Division, published 1988) was followed, setting a maximum temperature at 240 to 245° C.

Viscosity of polyimide precursor solutions was measured at 25° C. using a viscometer Model DVR-E (manufactured by K.K. Tokimec).

EXAMPLE 1

In a stream of nitrogen, 92.0 g (0.46 mol) of 4,4'-diaminodiphenyl ether and 9.12 g (0.44 mol) of 4-aminophenyl 4-amino-3-carbonamidophenyl ether were dissolved in 1,580.2 g of N-methyl-2-pyrrolidone to prepare an amine solution. Next, keeping the temperature of this solution at about 15° C., a mixture of 54.5 g (0.25 mol) of pyromellitic dianhydride and 80.5 g (0.25 mol) of 3,3',4,4'-benzophenonetetracarboxylic dianhydride was added while stirring. After their addition was completed, the reaction mixture was further reacted while stirring at about 15° C. for about 5 hours in an atmosphere of nitrogen, to obtain a polyimide precursor composition solution with a viscosity of about 30 poises. The polyimide precursor composition solution thus obtained contains as the polyimide precursor the polyamic acid represented by the following general formula (I).

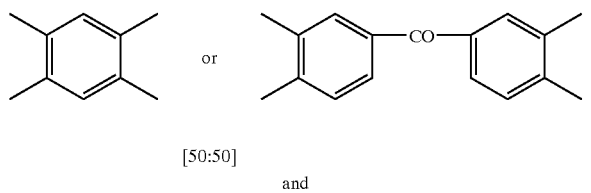

Here, the polyamide acid of the present Example is a copolymer wherein $R^1$ is

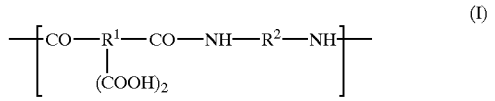

[50:50]

and $R^2$ is

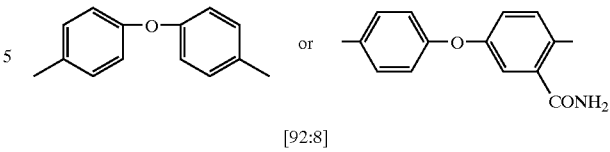

[92:8]

In the formulas (XI) and (XII), the numerals in brackets indicate the ratio of the numbers of repeating units in one molecule.

A wafer was prepared on which a semiconductor device comprising a capacitive insulation film formed using a ferroelectric material, a silicon nitride film formed on the outermost surface, and bonding pads for ensuring conduction were formed.

On this wafer, a PIQ coupler available from Hitachi Chemical Co., Ltd. was spin-coated, followed by heating at 300° C. for 4 minutes in the air using a hot-plate heating unit, and thereafter the above polyimide precursor composition solution was further spin-coated thereon, followed by heating at 140° C. for 1 minute in an atmosphere of nitrogen using the hot-plate heating unit.

Next, a positive photoresist OFPR800, available from Tokyo Ohka Kogyo Co., Ltd., was spin-coated thereon, followed by heating at 90° C. for 1 minute using the hot-plate heating unit to form a resist film on the surface of the polyimide precursor composition film. The resist film formed was then exposed through a photomask and developed to form in the resist film the openings where the underlying polyimide precursor film was laid bare, followed by heating at 160° C. for 1 minute using the hot-plate heating unit.

Next, using the resist developing solution aqueous alkali solution as it was, the polyimide precursor composition film was etched to form openings in the polyimide precursor composition film at its portions corresponding to the resist openings. Then the resist film was removed using a resist removing solution and a rinsing solution for exclusive use, and the polyimide precursor composition film was washed with water, followed by heating at 230° C. for 4 minutes and at 300° C. for 8 hours to make the polyimide precursor into an imide to form on the device surface a surface-protective polyimide film having openings at the bonding pad portions. The polyimide film thus formed was in a layer thickness of 2.3 μm. The Young's modulus and glass transition temperature of the polyimide film were measured in the manner as described above, to reveal that they were about 3,700 MPa and about 300° C., respectively.

Thereafter, using the polyimide film as a mask, the silicon nitride film covering the bonding pad portions was dry-etched with a mixed gas of 94% $CF_4$ and 6% $O_2$ to lay the aluminum electrode bare at the bonding pad portions.

At this stage, as electrical characteristics of the device, the rate of residual polarization of the ferroelectric film was measured to find that it was in a value only decreased by 5% compared with the rate of residual polarization of the initial ferroelectric film before the PIQ coupler treatment.

Figure 3:
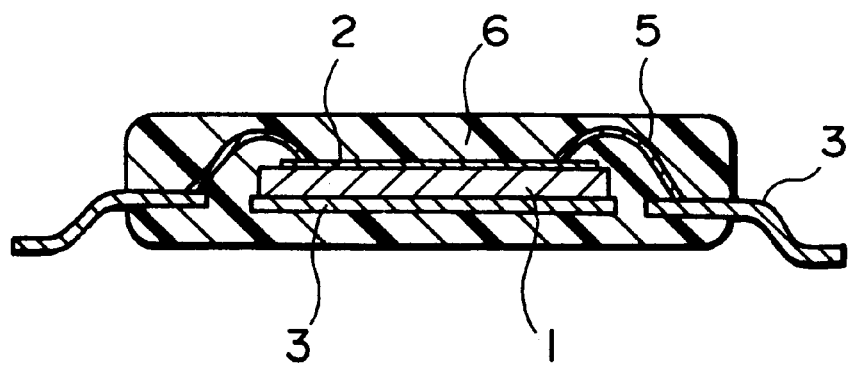
FIG. 3 is a cross-sectional view of a resin-encapsulated semiconductor apparatus fabricated in Example 1.

Next, this wafer with films thus processed was cut off at the scribing regions to obtain a semiconductor device having the surface-protective film. This semiconductor device was secured to a lead frame in the step of die bonding, and thereafter the semiconductor device was wired with gold wires across the bonding pad portions and outer terminals. The device thus wired was further encapsulated with a silica-containing biphenyl type epoxy resin available from Hitachi Chemical Co., Ltd. at a molding temperature of 180° C. and a molding pressure of 70 kg/cm$^2$ to form a resin-encapsulated portion. Finally, the outer terminals were bent into the predetermined shape to obtain a finished product of the resin-encapsulated semiconductor apparatus shown in FIG. 3.

The resin-encapsulated semiconductor apparatus thus obtained was tested to evaluate the solder reflow resistance in the manner as described above. As a result, neither peeling nor cracks occurred at the interface between the surface-protective polyimide film and the encapsulant epoxy resin, thus a resin-encapsulated semiconductor apparatus with a high reliability was obtainable.

COMPARATIVE EXAMPLE 1

The same wafer as that in Example 1 was prepared, and on this wafer with the semiconductor device a PIQ coupler available from Hitachi Chemical Co., Ltd. was spin-coated, followed by heating at 300° C. for 4 minutes in the air using a hot-plate heating unit, and thereafter a polyimide precursor solution PIQ-13, available from Hitachi Chemical Co., Ltd., was spin-coated thereon, followed by heating at 140° C. for 1 minute in an atmosphere of nitrogen using the hot-plate heating unit, to form a polyimide precursor composition film.

Next, openings were formed in the polyimide precursor composition film in the same manner as in Example 1, followed by heating at 230° C. for 4 minutes in an atmosphere of nitrogen using the hot-plate heating unit and further followed by heating at 350° C. for 30 minutes in an atmosphere of nitrogen using a lateral type diffusion furnace. Thus, a polyimide film (PIQ-13 film) having openings at the bonding pad portions was formed on the device surface. The PIQ-13 film thus formed was in a layer thickness of 2.3 $\mu$m. The Young's modulus and glass transition temperature of the PIQ-13 film were measured in the manner as described above, to reveal that they were about 3,300 MPa and about 310° C., respectively.

Thereafter, in the same manner as in Example 1, the aluminum electrode was laid bare at the bonding pad portions and the rate of residual polarization of the ferroelectric film was measured to find that it was in a value decreased by 60% compared with the value before the PIQ coupler treatment.

Next, a finished product of a resin-encapsulated semiconductor apparatus was produced in the same manner as in Example 1, and its solder reflow resistance was evaluated in the same manner as in Example 1. As a result, neither peeling nor cracks occurred at the interface between the surface-protective polyimide film and the encapsulant epoxy resin, but, compared with the device of Example 1, the resin-encapsulated semiconductor apparatus obtained in the present Comparative Example caused so great a deterioration in polarization characteristics of the ferroelectric film that it was unsuitable for practical use.

COMPARATIVE EXAMPLE 2

A surface-protective film was formed on the surface of the wafer with the semiconductor device in the same manner as Comparative Example 1 except that the heating time for the heat-curing of the polyimide precursor composition film at 350° C. was shortened to 8 minutes. The Young's modulus and glass transition temperature of the PIQ-13 film in the present Comparative Example were, like those in Comparative Example 1, about 3,300 MPa and about 310° C., respectively. However, the rate of residual polarization of the ferroelectric film was in a value decreased by 25% compared with the value before the PIQ coupler treatment, and, compared with the device of Example 1, the present device caused so great a deterioration in polarization characteristics that it was unsuitable for practical use.

COMPARATIVE EXAMPLE 3

The same wafer as that in Example 1 was prepared, and on this wafer with the semiconductor device a polyimide precursor composition PIX8803-9L, available from Hitachi Chemical Co., Ltd., was spin-coated, followed by heating at 100° C. for 1 minute and further at 230° C. for 8 minutes in an atmosphere of nitrogen using a hot-plate heating unit, to form a polyimide precursor composition film in a half-cured state.

Next, openings were formed in this polyimide precursor composition film in the same manner as in Example 1, followed by heating at 230° C. for 4 minutes in an atmosphere of nitrogen using the hot-plate heating unit to form a polyimide film (PIX8803-9L film) having openings at the bonding pad portions. The polyimide film thus formed was in a layer thickness of 2.3 $\mu$m. The Young's modulus and glass transition temperature of the PIX8803-9L film were measured in the manner as described above, to reveal that they were about 2,000 MPa and about 200° C., respectively.

Next, using the polyimide film as a mask, the silicon nitride film was dry-etched in the same manner as in Example 1 to lay the aluminum electrode bare at the bonding pad portions, and the rate of residual polarization of the ferroelectric film was measured to find that the difference between the value obtained and the value before the coating of the polyimide precursor composition was within 1%, showing almost no deterioration of characteristics.

Next, a finished product of a resin-encapsulated semiconductor apparatus was produced in the same manner as in Example 1, and its solder reflow resistance was evaluated in the same manner as in Example 1. As a result, peeling was seen to occur over the whole interface between the surface-protective polyimide film and the encapsulant epoxy resin, and only a resin-encapsulated semiconductor apparatus with an extremely low reliability was obtainable.

EXAMPLE 2

In a stream of nitrogen, 88.0 g (0.44 mol) of 4,4'-diaminodiphenyl ether and 13.68 g (0.06 mol) of 4-aminophenyl 4-amino-3-carbonamidophenyl ether were dissolved in 1,584 g of N-methyl-2-pyrrolidone to prepare an amine solution. Next, keeping the temperature of this solution at about 15° C., a mixture of 54.5 g (0.25 mol) of pyromellitic dianhydride and 80.5 g (0.25 mol) of 3,3',4,4'-benzophenonetetracarboxylic dianhydride was added while stirring. After their addition was completed, the mixture was further reacted while stirring at about 15° C. for about 5 hours in an atmosphere of nitrogen, to obtain a polyimide precursor composition solution with a viscosity of about 30 poises. The polyimide precursor composition solution thus obtained contains as the polyimide precursor the same polyamic acid copolymer as that of Example 1 except that $R^2$ is in a different copolymerization ratio. The $R^2$ in the present Example is

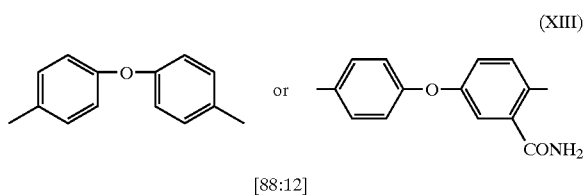

[88:12]

In the formula (XIII), the numeral in brackets indicates the ratio of the numbers of repeating units in one molecule.

Next, the same wafer as that in Example 1 was prepared, and on the surface of this wafer with the semiconductor device a PIQ coupler available from Hitachi Chemical Co., Ltd. was spin-coated, followed by heating at 260° C. for 4 minutes in the air using a hot-plate heating unit, and thereafter the above polyimide precursor composition solution was further spin-coated thereon, followed by heating at 140° C. for 1 minute in an atmosphere of nitrogen using the hot-plate heating unit. Thus, a polyimide precursor composition film was formed.

Openings were provided in this composition film in the same manner as in Example 1, followed by heating at 230° C. for 4 minutes and at 260° C. for 8 hours to make the polyimide precursor into an imide to form on the device surface a surface-protective polyimide film having openings at the bonding pad portions. The polyimide film thus formed was in a layer thickness of 2.3 μm. The Young's modulus and glass transition temperature of the polyimide film were measured in the manner as described above, to reveal that they were about 3,300 MPa and about 300° C., respectively.

At this stage, the rate of residual polarization of the ferroelectric film was measured to find that it was in a value only decreased by about 2% compared with the rate of residual polarization of the initial ferroelectric film before the PIQ coupler treatment.

Next, a finished product of a resin-encapsulated semiconductor apparatus was produced in the same manner as in Example 1, and the finished product thus obtained was tested to evaluate the solder reflow resistance. As a result, neither peeling nor cracks occurred at the interface between the surface-protective polyimide film and the encapsulant epoxy resin, thus a resin-encapsulated semiconductor apparatus with a high reliability was obtainable.

EXAMPLE 3

In a stream of nitrogen, 90.0 g (0.45 mol) of 4,4'-diaminodiphenyl ether and 9.6 g (0.05 mol) of bis(3-aminopropyl)tetramethyldisiloxane were dissolved in 1,584 g of N-methyl-2-pyrrolidone to prepare an amine solution. Next, keeping the temperature of this solution at about 15° C., 147 g (0.5 mol) of 3,3',4,4'-biphenyltetracarboxylic dianhydride was added while stirring. After its addition was completed, the reaction mixture was further reacted while stirring at about 15° C. for about 5 hours in an atmosphere of nitrogen, to obtain a polyimide precursor composition solution with a viscosity of about 50 poises. The polyimide precursor composition solution thus obtained contains as the polyimide precursor a polyamic acid copolymer comprised of a first repeating unit represented by the following general formula (XIV) and a second repeating unit represented by the following general formula (XV). Here, the proportion of the number of the second repeating unit to the total number of the first repeating unit and second repeating unit is 10%.

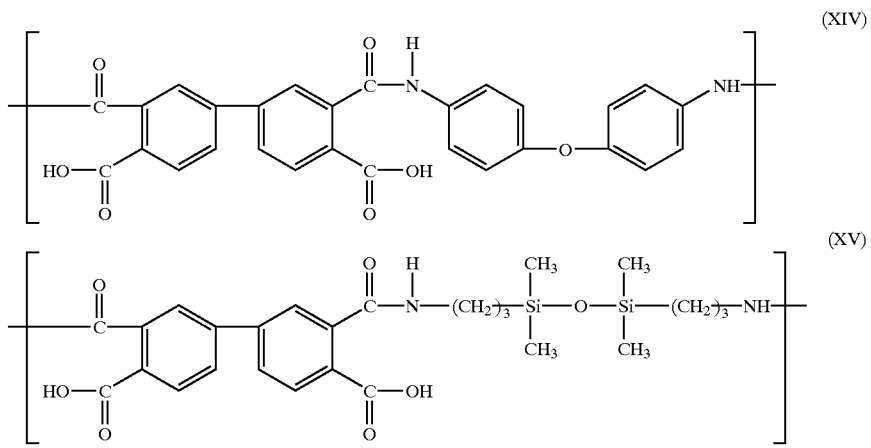

Next, the same wafer as that in Example 1 was prepared, and on the surface of this wafer with the semiconductor device a PIQ coupler available from Hitachi Chemical Co., Ltd. was spin-coated, followed by heating at 260° C. for 4 minutes in the air using a hot-plate heating unit, and thereafter the above polyimide precursor composition solution was further spin-coated thereon, followed by heating at 140° C. for 1 minute in an atmosphere of nitrogen using the hot-plate heating unit. Thus, a polyimide precursor composition film was formed.

Openings were provided in this composition film in the same manner as in Example 1, followed by heating at 230° C. for 4 minutes and at 260° C. for 8 minutes to make the polyimide precursor into an imide to form on the device surface a surface-protective polyimide film having openings at the bonding pad portions. The polyimide film thus formed was in a layer thickness of 2.3 μm. The Young's modulus and glass transition temperature of the polyimide film were measured in the manner as described above, to reveal that they were about 3,000 MPa and about 255° C., respectively.

At this stage, the rate of residual polarization of the ferroelectric film was measured to find that it was in a value only decreased by about 2% compared with the rate of residual polarization of the initial ferroelectric film before the PIQ coupler treatment.

Next, a finished product of a resin-encapsulated semiconductor apparatus was produced in the same manner as in Example 1, and the finished product thus obtained was tested to evaluate the solder reflow resistance. As a result, neither peeling nor cracks occurred at the interface between the surface-protective polyimide film and the sealing epoxy resin, thus a resin-encapsulated semiconductor apparatus with a high reliability was obtainable.

EXAMPLE 4

In a stream of nitrogen, 103.0 g (0.5 mol) of 3,3'-dimethylbenzidine was dissolved in 1,474.5 g of N-methyl-2-pyrrolidone, and 155.0 g (0.5 mol) of 4,4'-oxyphthalic dianhydride was added while stirring. After its addition was completed, the reaction mixture was further reacted while stirring at about 15° C. for about 5 hours in an atmosphere of nitrogen, to obtain a polyimide precursor composition solution with a viscosity of about 30 poises. The polyimide precursor composition solution thus obtained contains as the polyimide precursor a polyamide acid comprised of a repeating unit represented by the following general formula (XVI):

dimethylamino)propyl methacrylate and 5.0 parts by weight of 2,6-di(p-azidobenzal)-4-carboxycyclohexanone based on 100 parts by weight of the polyimide precursor polymer were added and dissolved to obtain a photosensitive composition solution.

Next, the same wafer as that in Example 1 was prepared, and on the surface of this wafer with the semiconductor device a PIQ coupler available from Hitachi Chemical Co., Ltd. was spin-coated, followed by heating at 250° C. for 4 minutes in the air using a hot-plate heating unit, and thereafter the above photosensitive composition solution was further spin-coated thereon, followed by heating at 85° C. for 1 minute and subsequently at 95° C. for 1 minute in an atmosphere of nitrogen using a hot-plate heating unit. Thus, a polyimide precursor composition film was formed.

This composition film was exposed through a photomask and then developed with a mixture solution comprised of 4 parts by volume of N-methyl-2-pyrrolidone and 1 part by volume of ethanol, followed by rinsing with ethanol to form openings at the bonding pad portions. Next, the film was

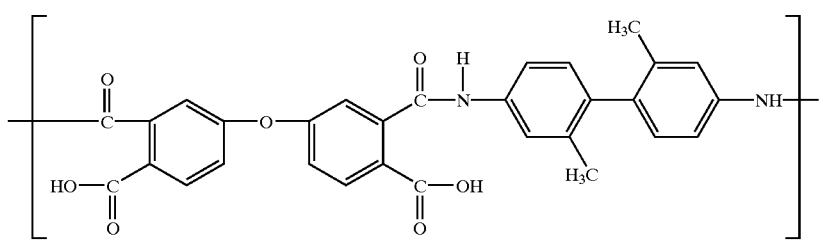

(XVI)

Next, the same wafer as that in Example 1 was prepared, and on the surface of this wafer with the semiconductor device a PIQ coupler available from Hitachi Chemical Co., Ltd. was spin-coated, followed by heating at 240° C. for 4 minutes in the air using a hot-plate heating unit, and thereafter the above polyimide precursor composition solution was further spin-coated thereon, followed by heating at 140° C. for 1 minute in an atmosphere of nitrogen using the hot-plate heating unit. Thus, a polyimide precursor composition film was formed.

Openings were provided in this composition film in the same manner as in Example 1, followed by heating at 230° C. for 4 minutes and at 240° C. for 10 minutes to make the polyimide precursor into an imide to form on the device surface a surface-protective polyimide film having openings at the bonding pad portions. The polyimide film thus formed was in a layer thickness of 2.3 μm. The Young's modulus and glass transition temperature of the polyimide film were measured in the manner as described above, to reveal that they were about 4,000 MPa and about 250° C., respectively.

At this stage, the rate of residual polarization of the ferroelectric film was measured to find that it was in a value decreased by about 1% at most, compared with the rate of residual polarization of the initial ferroelectric film before the PIQ coupler treatment.

Next, a finished product of a resin-encapsulated semiconductor apparatus was produced in the same manner as in Example 1, and the finished product thus obtained was tested to evaluate the solder reflow resistance. As a result, neither peeling nor cracks occurred at the interface between the surface-protective polyimide film and the encapsulant epoxy resin, thus a resin-encapsulated semiconductor apparatus with a high reliability was obtainable.

EXAMPLE 5

In the polyimide precursor composition solution synthesized in Example 1, 20.0 parts by weight of 3-(N,N- heated successively at 130° C. for 4 minutes, at 170° C. for 4 minutes, at 220° C. for 4 minutes and at 250° C. for 8 minutes using the hot-plate heating unit to cause the polyimide precursor to cure to form a polyimide film having openings at the bonding pad portions. The polyimide film thus formed was in a layer thickness of 2.3 μm. The Young's modulus and glass transition temperature of the polyimide film were also measured to reveal that they were about 3,300 MPa and about 300° C., respectively.

At this stage, the rate of residual polarization of the ferroelectric film was measured to find that it was in a value decreased by about 1% at most, compared with the rate of residual polarization of the initial ferroelectric film before the PIQ coupler treatment.

Next, a finished product of a resin-encapsulated semiconductor apparatus was produced in the same manner as in Example 1, and the finished product thus obtained was tested to evaluate the solder reflow resistance. As a result, neither peeling nor cracks occurred at the interface between the surface-protective polyimide film and the encapsulant epoxy resin, thus a resin-encapsulated semiconductor apparatus with a high reliability was obtainable.

EXAMPLE 6

In the polyimide precursor composition solution synthesized in Example 2, 20.0 parts by weight of 3-(N,N-dimethylamino)propyl methacrylate, 3.0 parts by weight of Michler's ketone and 3.0 parts by weight of bis-4,4'-diethylaminobenzophenone based on 100 parts by weight of the polyimide precursor polymer were added and dissolved to obtain a photosensitive composition solution.

Next, the same wafer as that in Example 1 was prepared, and on the surface of this wafer with the semiconductor device a PIQ coupler available from Hitachi Chemical Co., Ltd. was spin-coated, followed by heating at 270° C. for 4 minutes in the air using a hot-plate heating unit, and thereafter the above photosensitive composition solution was further spin-coated thereon, followed by heating at 85° C. for 1 minute and subsequently at 95° C. for 1 minute in an atmosphere of nitrogen using a hot-plate heating unit. Thus, a polyimide precursor composition film was formed.

Openings were formed in this composition film in the same manner as in Example 5, followed by heating successively at 130° C. for 4 minutes, at 170° C. for 4 minutes, at 220° C. for 4 minutes and at 270° C. for 8 minutes using the hot-plate heating unit to cause the polyimide precursor to cure to form a polyimide film having openings at the bonding pad portions. The polyimide film thus formed was in a layer thickness of 2.3 µm. The Young's modulus and glass transition temperature of the polyimide film were also measured to reveal that they were about 3,300 MPa and about 300° C., respectively.

At this stage, the rate of residual polarization of the ferroelectric film was measured to find that it was in a value decreased by about 1% at most, compared with the rate of residual polarization of the initial ferroelectric film before the PIQ coupler treatment.

Next, a finished product of a resin-encapsulated semiconductor apparatus was produced in the same manner as in Example 1, and the finished product thus obtained was tested to evaluate the solder reflow resistance. As a result, neither peeling nor cracks occurred at the interface between the surface-protective polyimide film and the encapsulant epoxy resin, thus a resin-encapsulated semiconductor apparatus with a high reliability was obtainable.

EXAMPLE 7

In the polyimide precursor composition solution synthesized in Example 3, 20.0 parts by weight of 3-(N,N-dimethylamino)propyl methacrylate and 5.0 parts by weight of 2,6-di(p-azidobezal)-4-carboxycyclohexanone based on 100 parts by weight of the polyimide precursor polymer were added and dissolved to obtain a photosensitive composition solution.

Next, the same wafer as that in Example 1 was prepared, and on the surface of this wafer with the semiconductor device a PIQ coupler available from Hitachi Chemical Co., Ltd. was spin-coated, followed by heating at 260° C. for 4 minutes in the air using a hot-plate heating unit, and thereafter the above photosensitive composition solution was further spin-coated thereon, followed by heating at 85° C. for 1 minute and subsequently at 95° C. for 1 minute in an atmosphere of nitrogen using a hot-plate heating unit. Thus, a polyimide precursor composition film was formed.

Openings were formed in this composition film in the same manner as in Example 5, followed by heating successively at 130° C. for 4 minutes, at 170° C. for 4 minutes, at 220° C. for 4 minutes and at 260° C. for 8 minutes using the hot-plate heating unit to cause the polyimide precursor to cure to form a polyimide film having openings at the bonding pad portions. The polyimide film thus formed was in a layer thickness of 2.3 µm. The Young's modulus and glass transition temperature of the polyimide film were also measured to reveal that they were about 3,000 MPa and about 260° C., respectively.

At this stage, the rate of residual polarization of the ferroelectric film was measured to find that it was in a value decreased by about 2% at most, compared with the rate of residual polarization of the initial ferroelectric film before the PIQ coupler treatment.

Next, a finished product of a resin-encapsulated semiconductor apparatus was produced in the same manner as in Example 1, and the finished product thus obtained was tested to evaluate the solder reflow resistance. As a result, neither peeling nor cracks occurred at the interface between the surface-protective polyimide film and the encapsulant epoxy resin, thus a resin-encapsulated semiconductor apparatus with a high reliability was obtainable.

EXAMPLE 8

In the polyimide precursor composition solution synthesized in Example 4, 20.0 parts by weight of 3-(N,N-dimethylamino)propyl methacrylate, 3.0 parts by weight of Michler's ketone and 3.0 parts by weight of bis-4,4'-diethylaminobenzophenone based on 100 parts by weight of the polyimide precursor polymer were added and dissolved to obtain a photosensitive composition solution.

Next, the same wafer as that in Example 1 was prepared, and the surface of this wafer with the semiconductor device was treated with the PIQ coupler in the same manner as in Example 5, and thereafter the above photosensitive composition solution was further spin-coated thereon followed by heating, in the same manner as in Example 5. Thus, a polyimide precursor composition film was formed.

Openings were formed in this composition film in the same manner as in Example 5, and the film was heat-cured in the same manner as in Example 5 to form a polyimide film. The polyimide film thus formed was in a layer thickness of 2.3 µm. The Young's modulus and glass transition temperature of the polyimide film were measured to reveal that they were about 4,000 MPa and about 250° C., respectively.

At this stage, the rate of residual polarization of the ferroelectric film was measured to find that it was in a value decreased by about 1% at most, compared with the rate of residual polarization of the initial ferroelectric film before the PIQ coupler treatment.

Next, a finished product of a resin-encapsulated semiconductor apparatus was produced in the same manner as in Example 1, and the finished product thus obtained was tested to evaluate the solder reflow resistance. As a result, neither peeling nor cracks occurred at the interface between the surface-protective polyimide film and the encapsulant epoxy resin, thus a resin-encapsulated semiconductor apparatus with a high reliability was obtainable.

EXAMPLE 9

The same wafer as that in Example 1 was prepared, and on the surface of this wafer with the semiconductor device a PIQ coupler available from Hitachi Chemical Co., Ltd. was spin-coated, followed by heating at 230° C. for 4 minutes in the air using a hot-plate heating unit, and thereafter the polyimide precursor composition solution synthesized in Example 4 was further spin-coated thereon, followed by heating at 140° C. for 1 minute in an atmosphere of nitrogen using a hot-plate heating unit. Thus, a polyimide precursor composition film was formed.

Openings were formed in this composition film in the same manner as in Example 4, followed by heating at 200° C. for 4 minutes and subsequently at 230° C. for 10 minutes using the hot-plate heating unit to cause the polyimide precursor to cure to form a surface-protective polyimide film having openings at the bonding pad portions. The polyimide film thus formed was in a layer thickness of 2.3 µm. The Young's modulus and glass transition temperature of the polyimide film were also measured to reveal that they were about 4,000 MPa and about 250° C., respectively.

At this stage, the rate of residual polarization of the ferroelectric film was measured to find that, like Example 4, the deterioration due to heat treatment was about 1% at most. A finished product of a resin-encapsulated semiconductor apparatus was produced in the same manner as in Example 1, and the finished product thus obtained had a solder reflow resistance as good as that in Example 4.

EXAMPLE 10

In the polyimide precursor composition solution synthesized in Example 4, 20.0 parts by weight of 3-(N,N-dimethylamino)propyl methacrylate and 6.0 parts by weight of Michler's ketone based on 100 parts by weight of the Next, keeping the temperature of this solution at about 15° C., 155.0 g (0.5 mol) of 4,4'-oxyphthalic dianhydride was added while stirring, and thereafter the reaction mixture was further stirred at about 15° C. for about 8 hours in an atmosphere of nitrogen, to obtain a polyimide precursor solution with a viscosity of about 30 poises.

The polyimide precursor composition solution thus obtained contains as the polyimide precursor a polyamic acid copolymer comprised of a first repeating unit represented by the above general formula (XVI) and a second repeating unit represented by the following general formula (XIX):

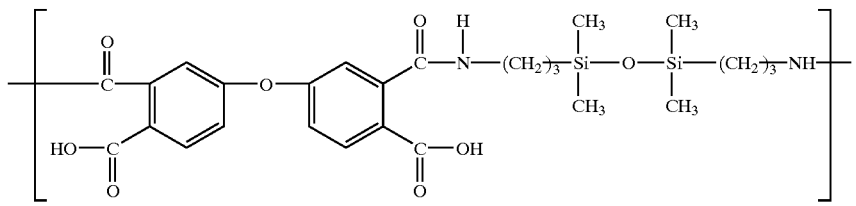

polyimide precursor polymer were added and dissolved to obtain a photosensitive composition solution.

Next, the same wafer as that in Example 1 was prepared, and the surface of this wafer with the semiconductor device was treated with the PIQ coupler in the same manner as in Example 9, and thereafter the above photosensitive composition solution was further spin-coated thereon, followed by heating at 85° C. for 1 minute and subsequently at 95° C. for 1 minute in an atmosphere of nitrogen using a hot-plate heating unit. Thus, a polyimide precursor composition film was formed.

Openings were formed in this composition film in the same manner as in Example 5, followed by heating successively at 130° C. for 4 minutes, at 170° C. for 4 minutes, at 200° C. for 4 minutes and at 230° C. for 10 minutes using the hot-plate heating unit to cause the polyimide precursor to cure to form a polyimide film having openings at the bonding pad portions. The polyimide film thus formed was in a layer thickness of 2.3 μm. The Young's modulus and glass transition temperature of the polyimide film were also measured to reveal that they were about 4,000 MPa and about 250° C., respectively.

At this stage, the rate of residual polarization of the ferroelectric film was measured to find that, like Example 4, the deterioration due to heat treatment was about 1% at most. A finished product of a resin-encapsulated semiconductor apparatus was produced in the same manner as in Example 1, and the finished product thus obtained had a solder reflow resistance as good as that in Example 4.

EXAMPLE 11

In a stream of nitrogen, 95.4 g (0.45 mol) of 3,3'-dimethylbenzidine and 9.6 g (0.05 mol) of bis(3-aminopropyl)tetramethyldisiloxane were dissolved in 1,040 g of N-methyl-2-pyrrolidone to prepare an amine solution.

Here, the number of the second repeating unit comprised about 10% of the whole. Using the polyimide precursor solution thus obtained, a photosensitive composition solution was prepared in the same manner as in Example 5.

Next, the same wafer as that in Example 1 was prepared, and on the surface of this wafer the photosensitive composition solution was spin-coated, followed by heating at 85° C. for 1 minute and subsequently at 95° C. for 1 minute in an atmosphere of nitrogen using a hot-plate heating unit. Thereafter, the composition film formed was exposed through a photomask and then developed with a mixture solution comprised of 4 parts by volume of N-methyl-2-pyrrolidone and 1 part by volume of ethanol, followed by rinsing with ethanol to form openings where the bonding pad portions were uncovered. Subsequently, the film was heated successively at 130° C. for 3 minutes, at 170° C. for 3 minutes, at 220° C. for 3 minutes and at 300° C. for 6 minutes using the hot-plate heating unit to cause the polyimide precursor to cure. The polyimide film thus formed was in a layer thickness of 2.3 μm. The Young's modulus and glass transition temperature of the polyimide film were about 4,000 MPa and about 260° C., respectively.

At this stage, the rate of residual polarization of the ferroelectric film was measured to find that it was in a value decreased by about 1% at most, compared with the rate of residual polarization of the initial ferroelectric film before the coating of the polyimide precursor solution.

Next, a finished product of a resin-encapsulated semiconductor apparatus was produced in the same manner as in Example 1, and thereafter was tested to evaluate the solder reflow resistance in the same manner as in Example 1. As a result, like Example 1, the product had a high reliability.

EXAMPLE 12

In the present Example, a resin-encapsulated semiconductor apparatus was fabricated in the same manner as in Example 11 except that the heating after the formation of openings was carried out successively at 130° C. for 3 minutes, at 170° C. for 3 minutes, at 220° C. for 3 minutes and at 350° C. for 2 minutes. The Young's modulus and glass transition temperature of the polyimide film thus formed were the same as those in Example 11.

At this stage, the rate of residual polarization of the ferroelectric film was measured to find that it was in a value decreased by about 5% at most, compared with the rate of residual polarization of the initial ferroelectric film before the coating of the polyimide precursor solution.

Next, a finished product of a resin-encapsulated semiconductor apparatus was produced in the same manner as in Example 1, and thereafter was tested to evaluate the solder reflow resistance in the same manner as in Example 1. As a result, like Example 1, the product had a high reliability.

What is claimed is:

1. A resin-encapsulated semiconductor apparatus comprising a semiconductor device having a ferroelectric film and a surface-protective film, and an encapsulant member comprising a resin; wherein said ferroelectric film is made of a dielectric material having a Perovskite crystal structure, and is a capacity insulation film of a capacitor of said semiconductor device;

said surface-protective film covers a surface of said semiconductor device fixed on a lead frame, except for a bonding pad portion and a scribe area;

said bonding pad portion of said semiconductor device and terminal of said lead frame are connected be bonding wire and;

said semiconductor device and said lead frame are encapsulated with said encapsulant member.

2. A rein-encapsulated semiconductor apparatus comprising a semiconductor device having a ferroelectric film and a surface-protective film, and an encapsulant member comprising a resin; wherein said ferroelectric film is made of a dielectric material having a Perovskite crystal structure, and is a capacity insulation film of a capacitor of said semiconductor device;

said surface-protective film covers a surface of said semiconductor device except for a bonding pad portion and a scribe area;

a lead frame is fixed on said surface-protective film; and said bonding pad portion of said semiconductor device and a terminal of said lead frame are connected by bonding wire; and said semiconductor device and said lead frame are encapsulated with said encapsulated member.

3. A rein-encapsulated semiconductor apparatus comprising a semiconductor device having a ferroelectric film and a surface-protective film, and an encapsulant member comprising a resin, wherein said ferroelectric film is made of a dielectric material having a Perovskite crystal structure, and is a capacity insulation film of a capacitor of said semiconductor device;

said surface-protective film covers an active area of said semiconductor device;

said semiconductor device is fixed on a lead frame;

a bonding pad of said semiconductor device and terminal of said lead frame are connected by bonding wire; and said semiconductor device and said lead frame are encapsulated with said encapsulant member.

4. A rein-encapsulated semiconductor apparatus comprising a semiconductor device having a ferroelectric film and a surface-protective film, and an encapsulant member comprising a resin, wherein said ferroelectric film is made of a dielectric material having a Perovskite crystal structure, and is a capacity insulation film of a capacitor of said semiconductor device;

a lead frame is fixed on said surface-protective film covering an active area of said semiconductor device;

a bonding pad portion of said semiconductor device and a terminal of said lead frame are connected by bonding wire; and said semiconductor device and said lead frame are encapsulated with an encapsulant member.

5. A resin-encapsulated semiconductor apparatus according to claim 1, wherein said surface-protective film comprises a polyimide.

6. A resin-encapsulated semiconductor apparatus according to claim 1, said surface-protective film has a glass transition temperature of from 240° C to 400° C.

7. A resin-encapsulated semi-conductor apparatus according to claim 1, wherein said surface-protective film has a Young's modulus of from 2600 MPa to 6 GPa.

8. A resin-encapsulated semiconductor apparatus according to claim 1, wherein said surface-protective film has a glass transition temperature of from 240° C to 400° C and has a Young's modulus of from 2600 MPa to 6 GPa.

9. A resin-encapsulated semi-conductor apparatus according to claim 5, wherein said polyimide has a glass transition temperature of from 240° C to 400° C.

10. A resin-encapsulated semiconductor apparatus according to claim 5, wherein said polyimide has a Young's modulus of from 2600 MPa to 6 GPa.

11. A resin-encapsulated semiconductor apparatus according to claim 5, wherein said polyimide has a glass transition temperature of from 240° C to 400° and has a Young's modulus of 2600 MPa to 6 GPa.

12. A resin-encapsulated semiconductor apparatus according to claim 1, wherein said encapsulant comprises silica and an epoxy resin.

13. A resin-encapsulated semiconductor apparatus according to claim 1, wherein at least one of electrodes of said capacitor having said ferroelectric film therebetween comprises a precious metal.

14. A resin-encapsulated semiconductor apparatus according to claim 1, wherein at lease one of electrodes of said capacitors having said ferroelectric film therebetween comprises a metal oxide or an oxidizing electrode.

15. A resin-encapsulated semiconductor apparatus according to claim 14, wherein said at least one of electrodes comprises a metal oxide, and said metal oxide is strontium ruthenium oxide or iridium oxide.

16. A resin-encapsulated semiconductor apparatus according to claim 14, wherein said oxidizing electrode comprises iridium.

17. A resin-encapsulated semiconductor apparatus according to claim 13, wherein said precious metal comprises platinum.

18. A resin-encapsulated semiconductor apparatus according to claim 2, wherein said surface-protective film comprises a polyimide.

19. A resin-encapsulated semiconductor apparatus according to claim 2, wherein said surface-protective film has a glass transition temperature of from 240° C to 400° C.

20. A resin-encapsulated semiconductor apparatus according to claim 2, wherein said surface-protective film has a Young's modulus of from 2600 MPa to 6 GPa.

21. A resin-encapsulated semiconductor apparatus according to claim 2, wherein said surface-protective film has a glass transition temperature of from 240° C to 400° C and has a Young's modulus of from 2600 MPa to 6 GPa.

22. A resin-encapsulated semiconductor apparatus according to claim 18, wherein said polyimide has a glass transition temperature of from 240° C. to 400° C.

23. A resin-encapsulated semiconductor apparatus according to claim 18, wherein said polyimide has a Young's modulus of from 2600 MPa to 6 GPa.

24. A resin-encapsulated semiconductor apparatus according to claim 18, wherein said polyimide has a glass transition temperature of from 240° C. to 400° C. and has a Young's modulus of from 2600 MPa to 6 GPa.

25. A resin-encapsulated semiconductor apparatus according to claim 2, wherein said encapsulant comprises silica and an epoxy resin.

26. A resin-encapsulated semiconductor apparatus according to claim 2, wherein at least one of electrodes of said capacitor having a ferroelectric film therebetween comprises a precious metal.

27. A resin-encapsulated semiconductor apparatus according to claim 2, wherein at least on of electrode of said capacitor having said ferroelectric film therebetween comprises a metal oxide or an oxidizing electrode.

28. A resin-encapsulated semiconductor apparatus according to claim 27, wherein at least one of electrodes comprises a metal oxide, and said metal oxide is strontium ruthenium oxide or iridium oxide.

29. A resin-encapsulated semiconductor apparatus according to claim 27, wherein said oxidizing electrode comprises iridium.

30. A resin-encapsulated semiconductor apparatus according to claim 26, wherein said precious metal comprises platinum.

* * * * *